(12) United States Patent
Pagaila

(10) Patent No.: US 8,268,677 B1
(45) Date of Patent: Sep. 18, 2012

(54) SEMICONDUCTOR DEVICE AND METHOD OF FORMING SHIELDING LAYER OVER SEMICONDUCTOR DIE MOUNTED TO TSV INTERPOSER

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/043,179

(22) Filed: Mar. 8, 2011

(51) Int. Cl.
*H01L 21/00* (2006.01)

(52) U.S. Cl. ............. 438/127; 438/113; 257/E21.502

(58) Field of Classification Search ............. 438/63; 257/E21.5, E21.513
See application file for complete search history.

(56) References Cited

U.S. PATENT DOCUMENTS

| 6,838,748 | B2 | 1/2005 | Ishio et al. |
| 7,687,895 | B2 | 3/2010 | Brunnbauer et al. |
| 7,701,040 | B2 | 4/2010 | Huang et al. |
| 2007/0197013 | A1* | 8/2007 | Trezza ............. 438/597 |
| 2009/0212420 | A1* | 8/2009 | Hedler et al. ............. 257/737 |
| 2009/0302435 | A1* | 12/2009 | Pagaila et al. ............. 257/659 |
| 2009/0302437 | A1 | 12/2009 | Kim et al. |
| 2010/0159643 | A1 | 6/2010 | Takahashi et al. |

* cited by examiner

*Primary Examiner* — Cheung Lee
(74) *Attorney, Agent, or Firm* — Robert D. Atkins; Patent Law Group: Atkins & Associates, P.C.

(57) ABSTRACT

A semiconductor device has a plurality of conductive vias formed partially through a substrate. A conductive layer is formed over the substrate and electrically connected to the conductive vias. A semiconductor die is mounted over the substrate. An encapsulant is deposited over the semiconductor die and substrate. A trench is formed through the encapsulant around the semiconductor die. A shielding layer is formed over the encapsulant. The trench is formed partially through the substrate and the shielding layer is formed in the trench partially through the substrate. An insulating layer can be formed in the trench prior to forming the shielding layer. A portion of the substrate is removed to expose the conductive vias. An interconnect structure is formed over the substrate opposite the semiconductor die. The interconnect structure is electrically connected to the conductive vias. The shielding layer is electrically connected to the interconnect structure.

31 Claims, 12 Drawing Sheets

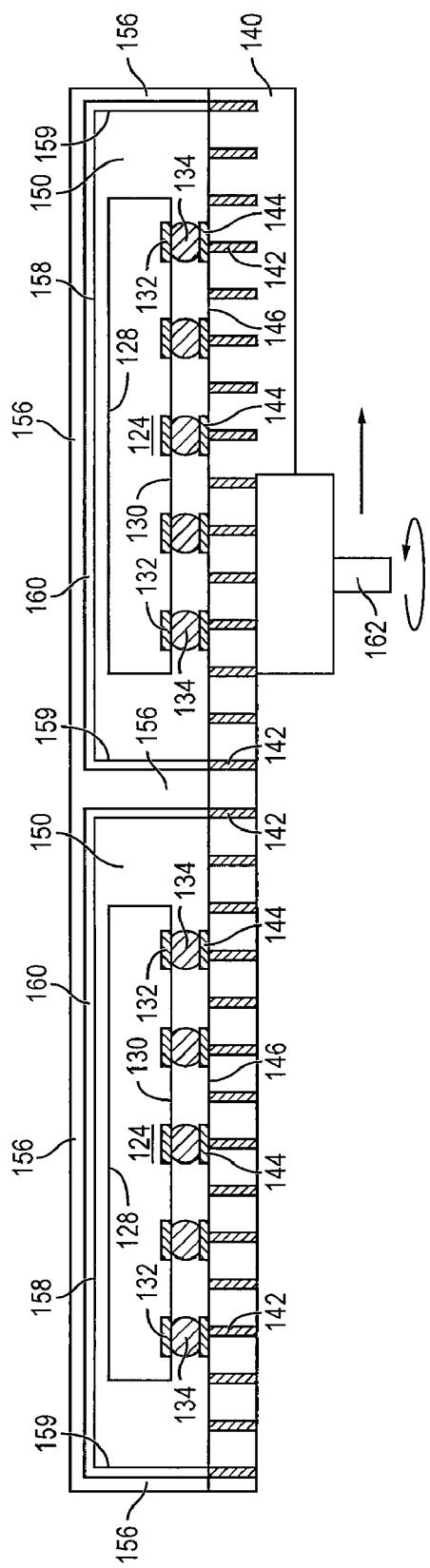
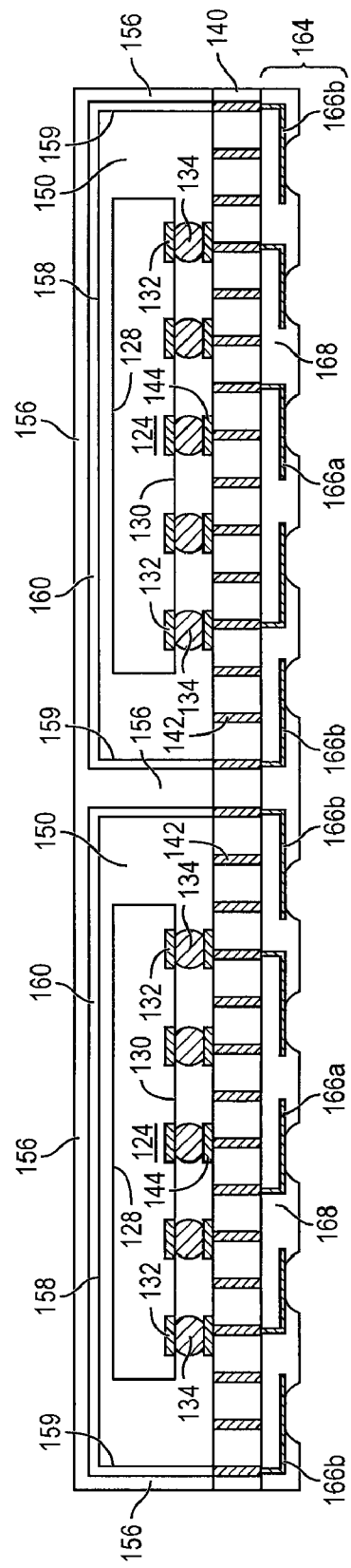
FIG. 4i
FIG. 4j

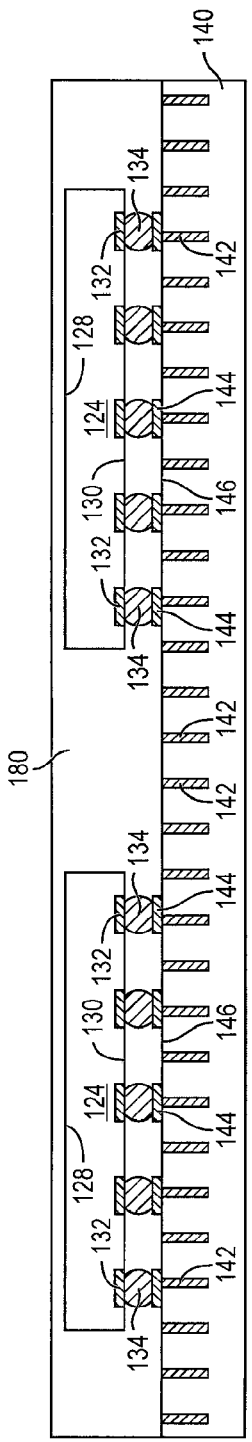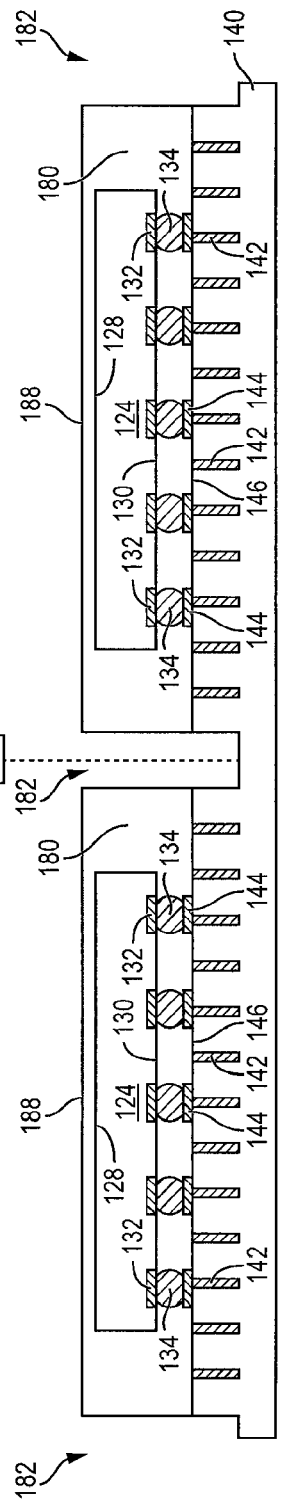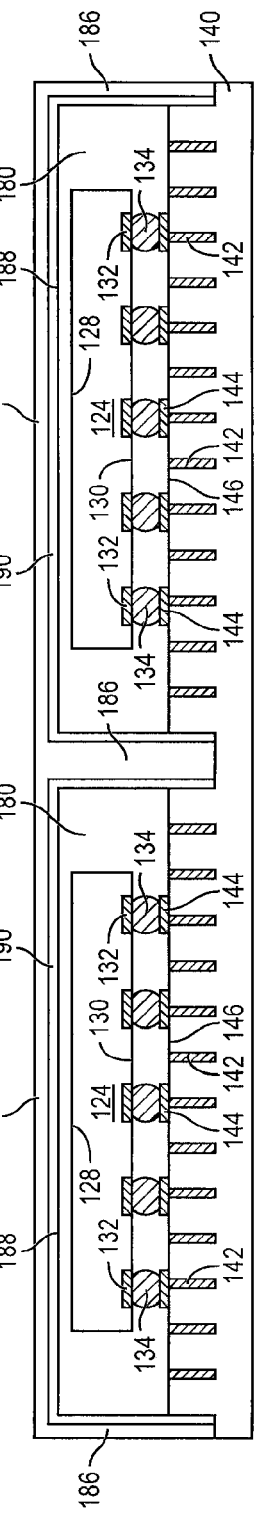
FIG. 6a
FIG. 6b
FIG. 6c

SEMICONDUCTOR DEVICE AND METHOD OF FORMING SHIELDING LAYER OVER SEMICONDUCTOR DIE MOUNTED TO TSV INTERPOSER

FIELD OF THE INVENTION

The present invention relates in general to semiconductor devices and, more particularly, to a semiconductor device and method of forming an EMI and RFI shielding layer over a semiconductor die mounted to a TSV interposer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk, which can interfere with device operation.

Semiconductor devices commonly use a metal shielding layer mounted to an encapsulant formed over the semiconductor die to reduce EMI and RFI. The shield layer is typically electrically connected through a build-up interconnect structure to a low impedance ground point to dissipate the EMI and RFI energy.

SUMMARY OF THE INVENTION

A need exists to isolate semiconductor die from EMI, RFI, and other inter-device interference. Accordingly, in one embodiment, the present invention is a method of making a semiconductor device comprising the steps of providing a substrate, forming a plurality of conductive vias partially through the substrate, mounting a semiconductor die over the substrate, depositing an encapsulant over the semiconductor die and substrate, forming a trench through the encapsulant around the semiconductor die, forming a shielding layer over the encapsulant, removing a portion of the substrate to expose the conductive vias, and forming an interconnect structure over the substrate opposite the semiconductor die. The interconnect structure is electrically connected to the conductive vias.

In another embodiment, the present invention is a method of making a semiconductor device comprising the steps of providing a substrate, forming a plurality of conductive vias in the substrate, mounting a semiconductor die over the substrate, depositing an encapsulant over the semiconductor die and substrate, forming a trench through the encapsulant proximate to the semiconductor die, forming a shielding layer over the encapsulant, and forming an interconnect structure over the substrate opposite the semiconductor die. The interconnect structure is electrically connected to the conductive vias.

In another embodiment, the present invention is a method of making a semiconductor device comprising the steps of providing a TSV substrate, mounting a semiconductor die over the TSV substrate, depositing an encapsulant over the semiconductor die and TSV substrate, forming a trench through the encapsulant proximate to the semiconductor die, and forming a shielding layer over the encapsulant and into the trench.

In another embodiment, the present invention is a semiconductor device comprising a substrate and plurality of conductive vias formed in the substrate. A semiconductor die is mounted over the substrate. An encapsulant is deposited over the semiconductor die and substrate. A trench is formed through the encapsulant proximate to the semiconductor die. A shielding layer is formed over the encapsulant. An interconnect structure is formed over the substrate opposite the semiconductor die. The interconnect structure is electrically connected to the conductive vias.

BRIEF DESCRIPTION OF THE DRAWINGS

FIGS. 4a-4k illustrate a process of forming an EMI and RFI shielding layer over a semiconductor die mounted to a TSV interposer;

FIGS. 6a-6f illustrate a process of forming an EMI and RFI shielding layer over a semiconductor die and extending into the TSV interposer;

DETAILED DESCRIPTION OF THE DRAWINGS

Figure 1:
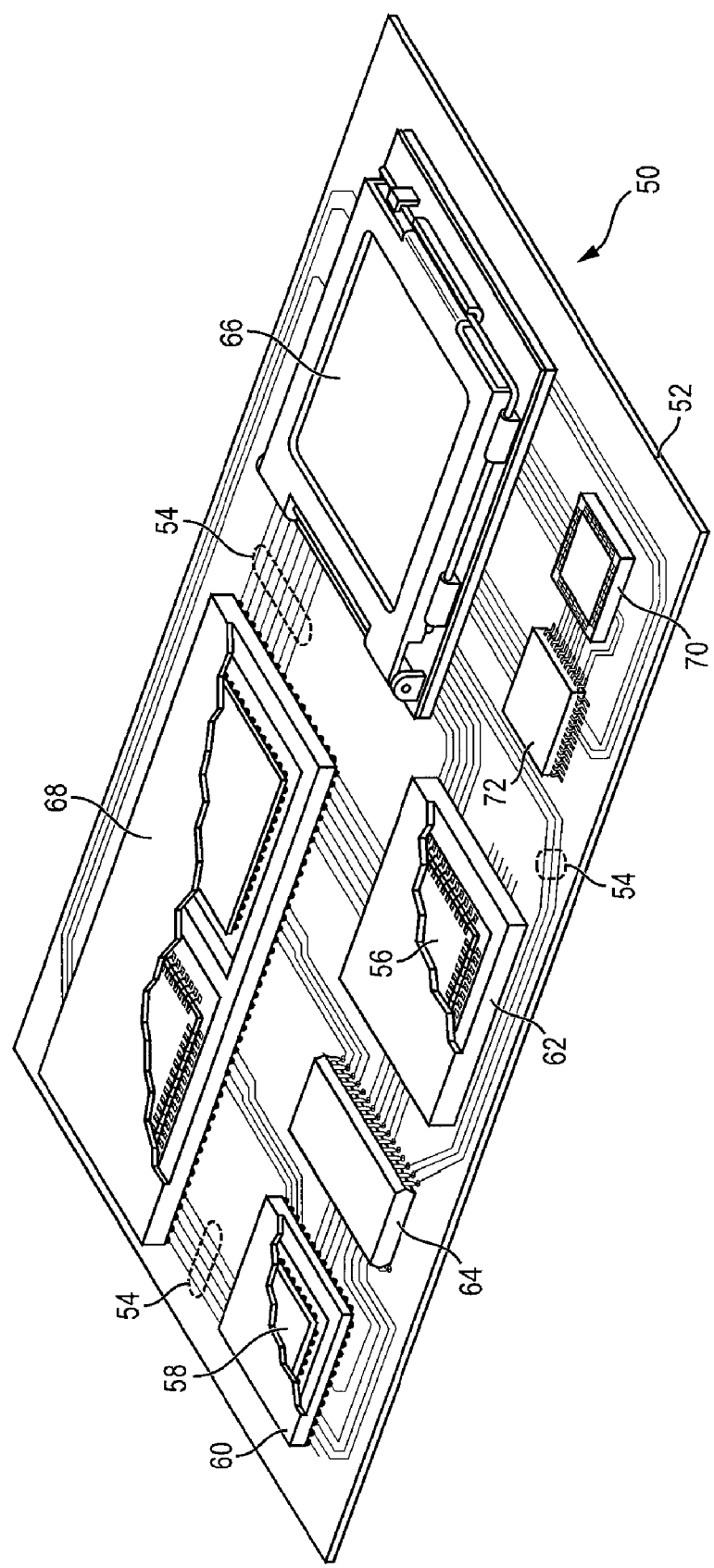
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
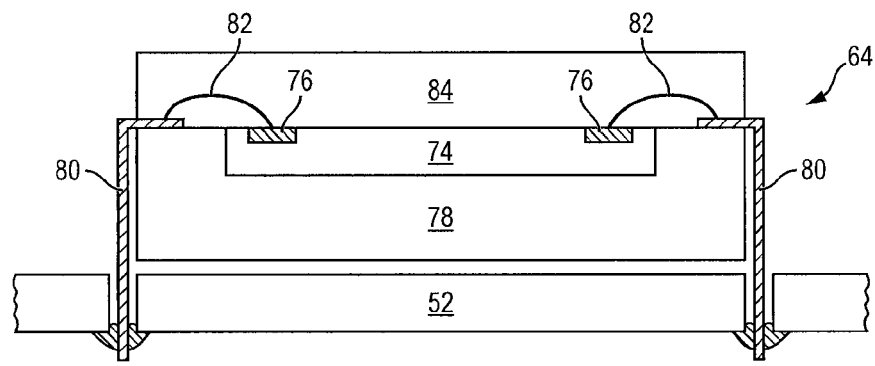
FIGS. 2a-2c illustrate further detail of the representative semiconductor packages mounted to the PCB.
Figure 2B:
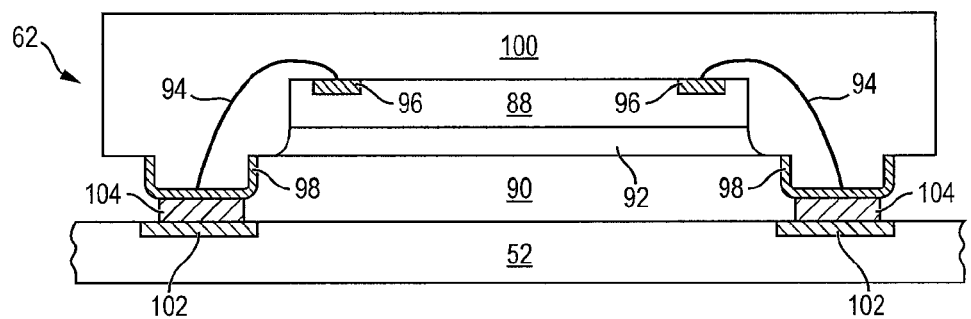
Figure 2C:
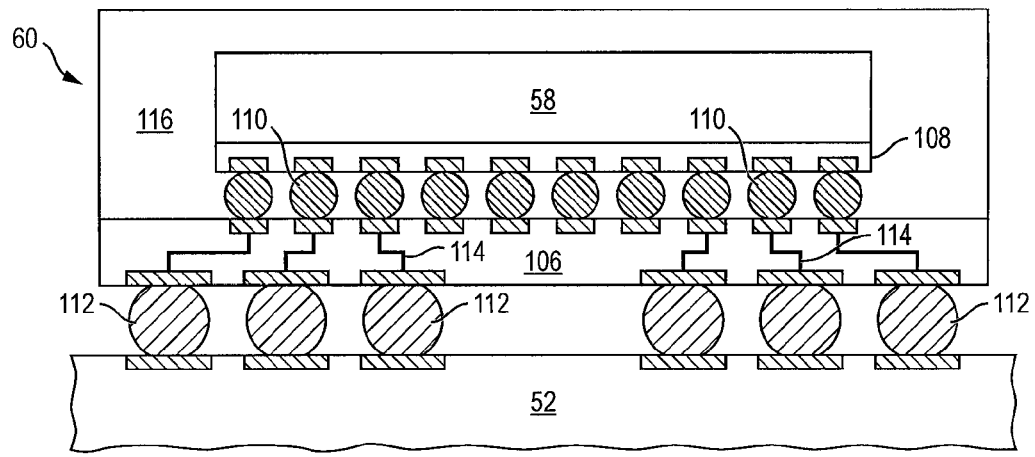

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
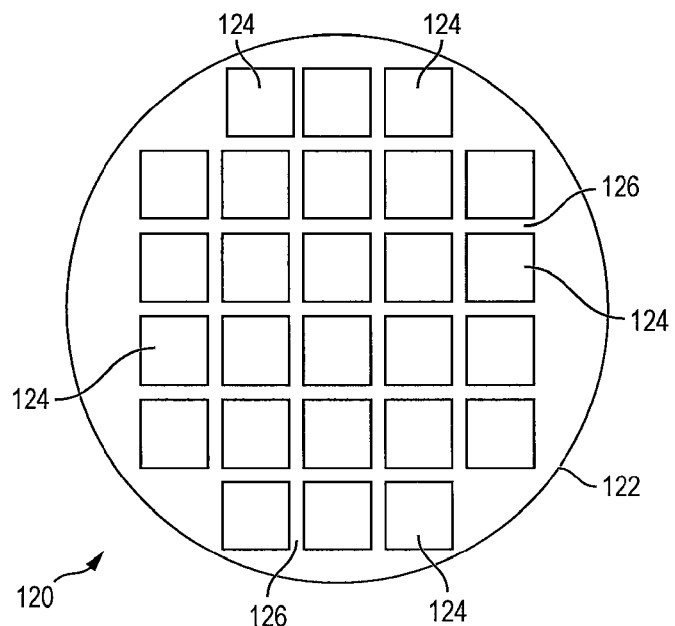
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124. In one embodiment, semiconductor die 124 may have dimensions ranging from 2×2 millimeters (mm) to 15×15 mm.

Figure 3B:
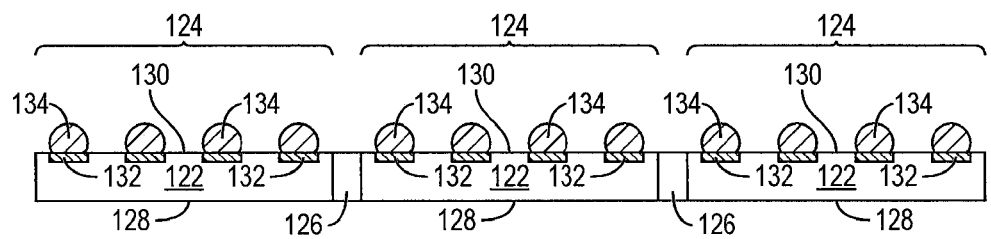

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. Semiconductor die 124 can be a flip-chip type die, wire-bonded die, or conductive through silicon via (TSV) die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads are disposed a first distance from the edge of the die, and a second row of contact pads alternating with the first row are disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pad 132 using a suitable attachment or bonding process. For example, the bump material can be compression bonded to contact pad 132. The bump material can also be reflowed by heating the material above its melting point to form spherical balls or bumps 134. In some applications, bumps 134 are reflowed a second time to improve electrical contact to contact pad 132. Bumps 134 represent one type of interconnect structure that can be formed over contact pad 132. The interconnect structure can also use stud bump, micro bump, or other electrical interconnect.

Figure 3C:
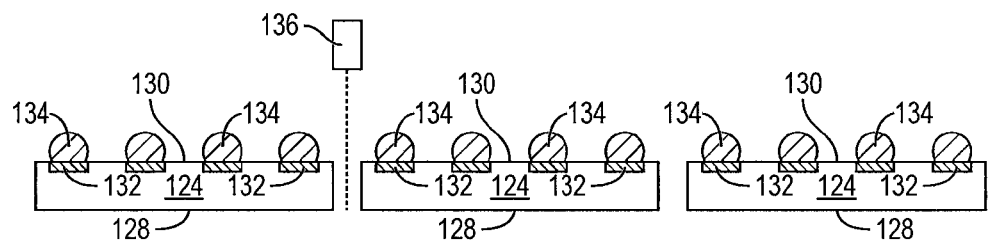

In FIG. 3c, semiconductor wafer 120 is singulated through saw street 126 using a saw blade or laser cutting tool 136 into individual semiconductor die 124.

Figure 4A:
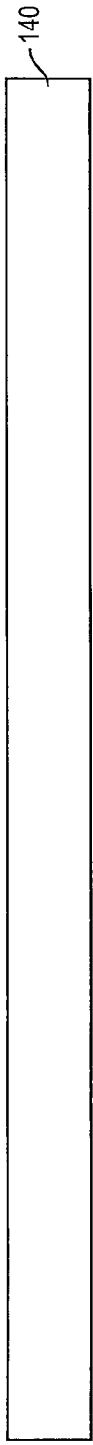

FIGS. 4a-4k illustrate, in relation to FIGS. 1 and 2a-2c, a process of forming an EMI and RFI shielding layer over a semiconductor die mounted to a TSV interposer. In FIG. 4a, a wafer-level substrate or interposer 140 contains base material such as silicon, germanium, gallium arsenide, indium phosphide, silicon carbide, or other suitable material for structural support.

Figure 4B:
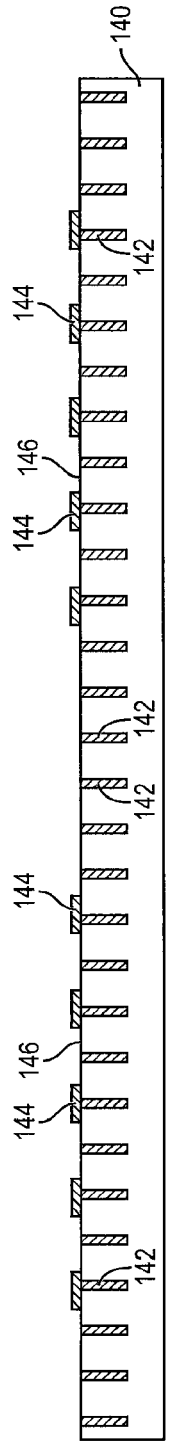

In FIG. 4b, a plurality of vias is formed partially through interposer 140 using mechanical drilling, laser drilling, or deep reactive ion etching (DRIE). In one embodiment, the vias are cut through 60% of the thickness of interposer 140. The vias are filled with Al, Cu, Sn, Ni, Au, Ag, Ti, (W), poly-silicon, or other suitable electrically conductive material using electrolytic plating, electroless plating process, or other suitable deposition process to form z-direction blind conductive through silicon vias (TSV) 142.

An electrically conductive layer or redistribution layer (RDL) 144 is formed over surface 146 of TSV interposer 140 using a patterning and metal deposition process such as sputtering, electrolytic plating, and electroless plating. Conductive layer 144 can be one or more layers of Al, Cu, Sn, Ni, Au, Ag, or other suitable electrically conductive material. One portion of conductive layer 144 is electrically connected to conductive TSVs 142. Other portions of conductive layer 144 can be electrically common or electrically isolated depending on the design and function of semiconductor die 124.

Figure 4C:
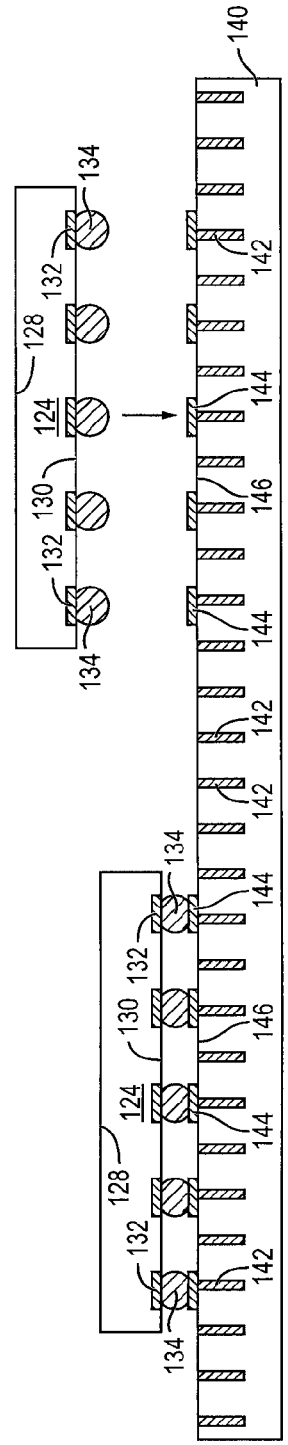
Figure 4D:
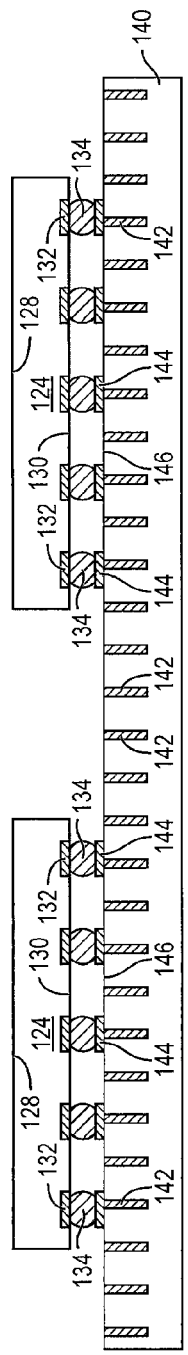

In FIG. 4c, semiconductor die 124 from FIGS. 3a-3c are mounted to TSV interposer 140 using a pick and place operation with active surface 130 and bumps 134 oriented toward the TSV interposer. FIG. 4d shows semiconductor die 124 mounted to TSV interposer 140. Bumps 134 are electrically connected to conductive layer 144 and conductive TSVs 142.

Figure 4E:
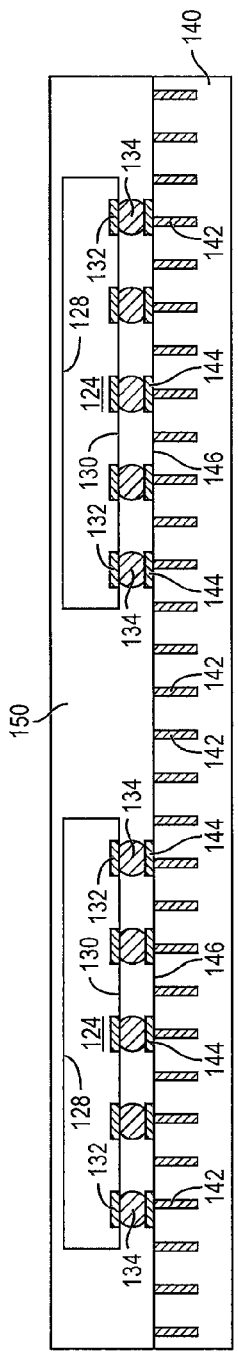

In FIG. 4e, an encapsulant or molding compound 150 is deposited over TSV interposer 140 and semiconductor die 124 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants.

Figure 4F:
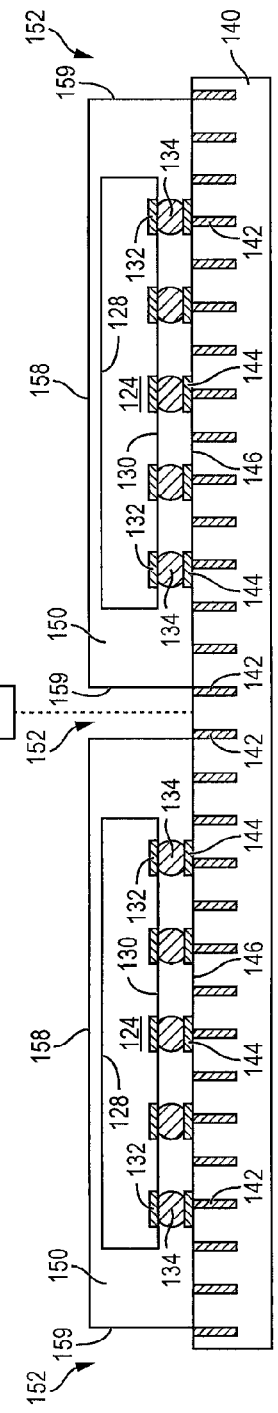
Figure 4G:
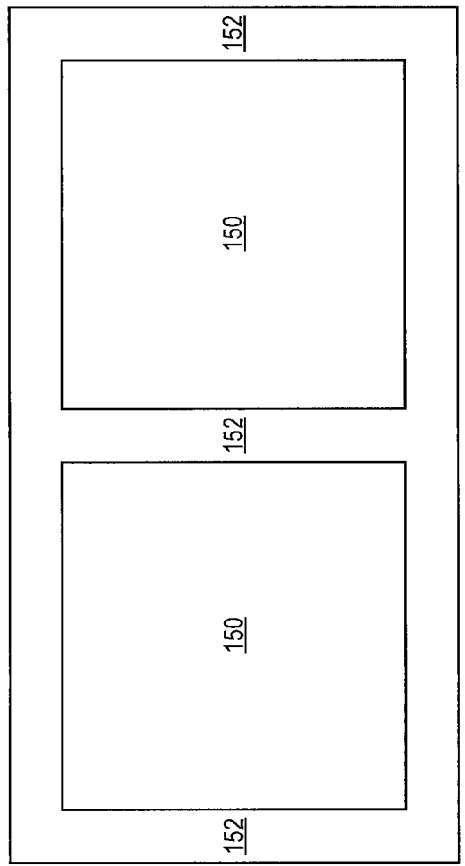

In FIG. 4f, a trench or channel 152 is cut completely through encapsulant 150 and terminating at TSV interposer 140 using saw blade or laser cutting tool 154. FIG. 4g shows a top view of trench 152 formed in encapsulant 150 around the peripheral area of semiconductor die 124.

Semiconductor die 124 may contain baseband circuits that generate EMI, RFI, or other inter-device interference, such as capacitive, inductive, or conductive coupling. In other embodiments, semiconductor die 124 contain IPDs that are susceptible to EMI, RFI, and inter-device interference. For example, the IPDs contained within semiconductor die 124 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

Figure 4H:
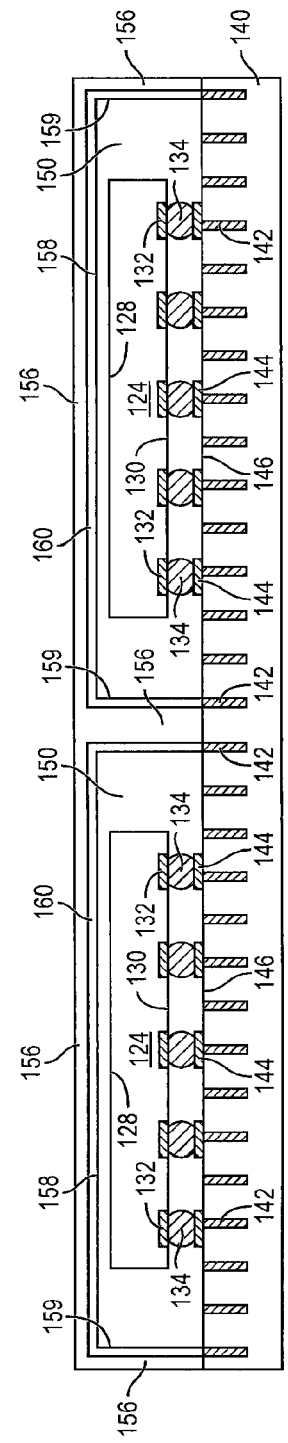

To reduce the effects of EMI and RFI, a shielding layer 156 is conformally deposited over top surface 158 and side surface 159 of encapsulant 150 around semiconductor die 124, as shown in FIG. 4h. Accordingly, shielding layer 156 covers a top portion and side portion of encapsulant 150 proximate to semiconductor die 124. Shielding layer 156 is substantially flat across top surface 158 of encapsulant 150. An optional seed layer 160 can be conformally deposited over top surface 158 and side surface 159 of encapsulant 150 prior to forming shielding layer 156. Shielding layer 156 can be Al, ferrite or carbonyl iron, stainless steel, nickel silver, low-carbon steel, silicon-iron steel, foil, conductive resin, conductive paste, and other metals and composites capable of blocking or absorbing EMI, RFI, and other inter-device interference. Shielding layer 156 can also be a non-metal material such as carbon-black or aluminum flake to reduce the effects of EMI and RFI. Seed layer 160 can be made with Cu, Ni, nickel vanadium (NiV), Au, or Al. Shielding layer 156 and seed layer 160 are patterned and conformally deposited using an electrolytic plating, electroless plating, sputtering, PVD, CVD, or other suitable metal deposition process. For non-metal materials, shielding layer 156 can be applied by lamination, spraying, or painting.

In FIG. 4i, a portion of TSV interposer 140 is removed by grinder 162 to expose conductive TSVs 142 opposite conductive layer 144.

In FIG. 4j, a build-up interconnect structure 164 is formed over encapsulant 150 and semiconductor die 124. The build-up interconnect structure 164 includes an electrically conductive layer or RDL 166 formed using a patterning and metal deposition process such as sputtering, electrolytic plating, and electroless plating. Conductive layer 166 can be one or more layers of Al, Cu, Sn, Ni, Au, Ag, or other suitable electrically conductive material. Conductive layer 166a is electrically connected to contact pads 132 for routing signals. Conductive layer 166b is electrically connected through TSVs 142 to shielding layer 156 as a low impedance ground point. Other portions of conductive layer 166 can be electrically common or electrically isolated depending on the design and function of semiconductor die 124.

The build-up interconnect structure 164 further includes an insulating or passivation layer 168 formed between conductive layer 166 for electrical isolation using PVD, CVD, printing, spin coating, spray coating, sintering or thermal oxidation. The insulating layer 168 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 168 is removed by an etching process to expose conductive layer 166 for bump formation or additional package interconnect.

Figure 4K:
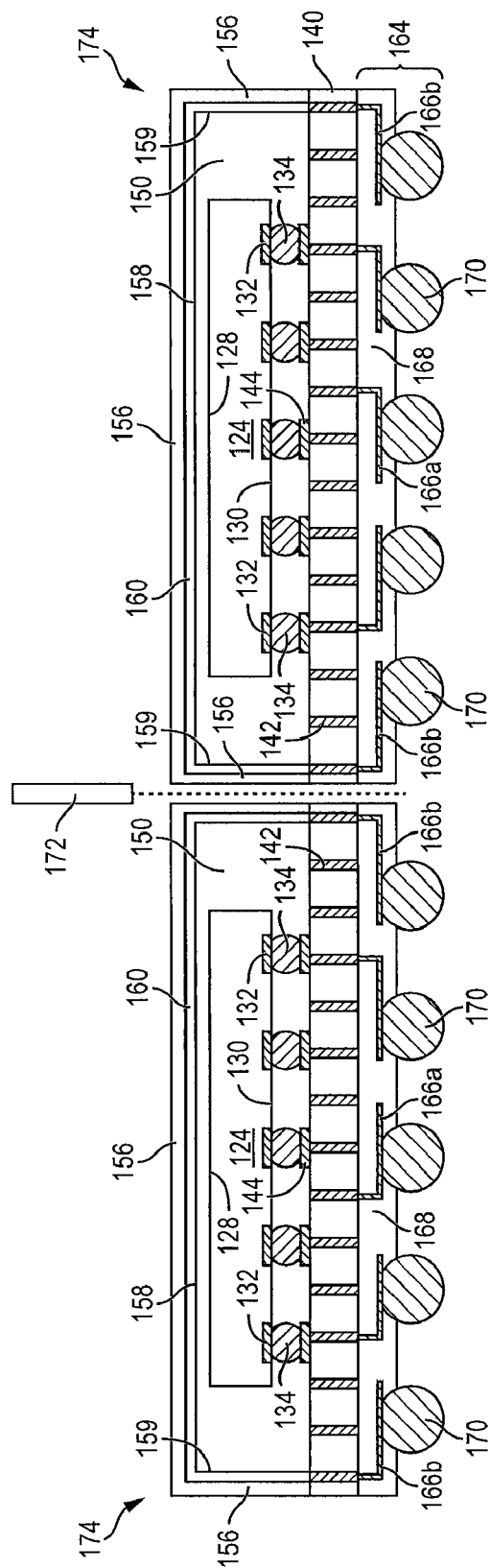

In FIG. 4k, an electrically conductive bump material is deposited over build-up interconnect structure 164 and electrically connected to conductive layer 166 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 166 using a suitable attachment or bonding process. In one embodiment, the bump material is reflowed by heating the material above its melting point to form spherical balls or bumps 170. In some applications, bumps 170 are reflowed a second time to improve electrical contact to conductive layer 166. An under bump metallization (UBM) layer can be formed under bumps 170. The bumps can also be compression bonded to conductive layer 166. Bumps 170 represent one type of interconnect structure that can be formed over conductive layer 166. The interconnect structure can also use bond wires, stud bump, micro bump, or other electrical interconnect.

The semiconductor device shown in FIG. 4k is singulated through shielding layer 156 and TSV interposer 140 using saw blade or laser cutting tool 172 to separate individual semiconductor die 124 into individual Fo-WLCSP 174. Shielding layer 156 is electrically connected to an external low impedance ground point through conductive TSVs 142 and build-up interconnect structure 164.

Figure 5:
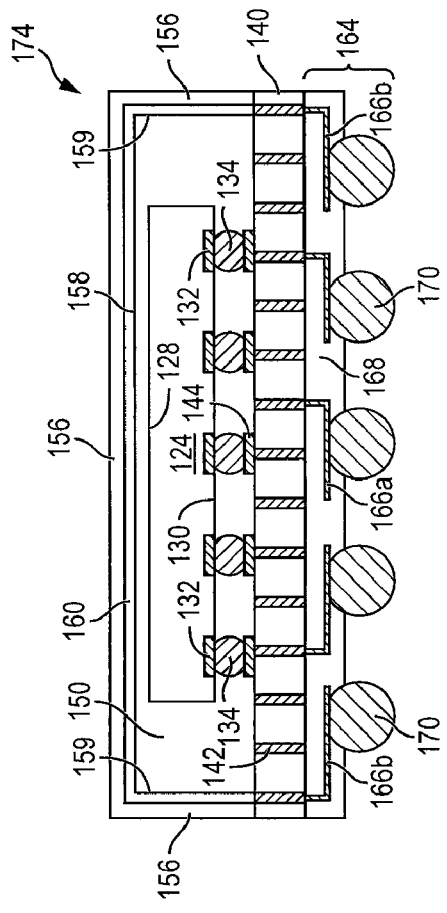
FIG. 5 illustrates the EMI and RFI shielding layer over the semiconductor die mounted to the TSV interposer.

FIG. 5 shows Fo-WLCSP 174 after singulation. Semiconductor die 124 is electrically connected through TSV interposer 140 to conductive layer 166a of interconnect structure 164 and bumps 170. The wafer-level TSV interposer 140 with shielding layer 156 provides higher productivity in terms of manufacturing units per hour (UPH) at lower production cost for Fo-WLCSP 174. The flat shielding layer 156 is readily formed over encapsulant 150 to block or absorb EMI, RFI, and other inter-device interference. Shielding layer 156 provides EMI coverage over the top and around the sides of semiconductor die 124 and routes EMI, RFI, and other interfering signals through TSV 142, conductive layer 166b, and bumps 170 to an external low-impedance ground point. Accordingly, the flat shielding layer 156 provides effective EMI and RFI shielding for the top and sides of semiconductor die 124.

In another embodiment, continuing from FIG. 4d, an encapsulant or molding compound 180 is deposited over TSV interposer 140 and semiconductor die 124 using a paste printing, compressive molding, transfer molding, liquid encapsulant molding, vacuum lamination, spin coating, or other suitable applicator, as shown in FIG. 6a. Encapsulant 180 can be polymer composite material, such as epoxy resin with filler, epoxy acrylate with filler, or polymer with proper filler. Encapsulant 180 is non-conductive and environmentally protects the semiconductor device from external elements and contaminants.

In FIG. 6b, a trench or channel 182 is cut completely through encapsulant 180 and partially through TSV interposer 140 using saw blade or laser cutting tool 184. Trench 182 is formed around a peripheral area of semiconductor die 124, similar to FIG. 4g. Trench 182 extends partially through interposer 140 to a bottom of TSVs 142.

To reduce the effects of EMI and RFI, a shielding layer 186 is conformally deposited over top surface 188 of encapsulant 180 and into trench 182 around semiconductor die 124, as shown in FIG. 6c. Shielding layer 186 extends to a bottom of TSVs 142. Accordingly, shielding layer 186 covers a top portion and side portion of semiconductor die 124. Shielding layer 186 is substantially flat across top surface 188 of encapsulant 180. An optional seed layer 190 can be conformally deposited over top surface 188 of encapsulant 180 and into trench 182 prior to forming shielding layer 186. Shielding layer 186 can be Al, ferrite or carbonyl iron, stainless steel, nickel silver, low-carbon steel, silicon-iron steel, foil, conductive resin, conductive paste, and other metals and composites capable of blocking or absorbing EMI, RFI, and other inter-device interference. Shielding layer 186 can also be a non-metal material such as carbon-black or aluminum flake to reduce the effects of EMI and RFI. Seed layer 190 can be made with Cu, Ni, NiV, Au, or Al. Shielding layer 186 and seed layer 190 are patterned and conformally deposited using an electrolytic plating, electroless plating, sputtering, PVD, CVD, or other suitable metal deposition process. For non-metal materials, shielding layer 186 can be applied by lamination, spraying, or painting.

Figure 6D:
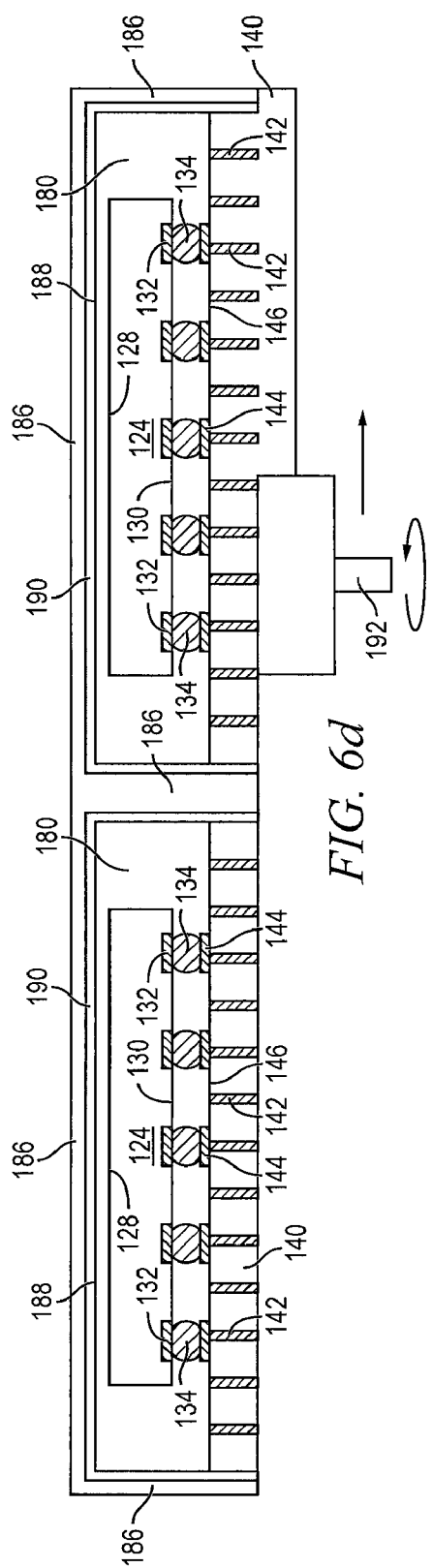

In FIG. 6d, a portion of TSV interposer 140 is removed by grinder 192 to expose conductive TSVs 142 and shielding layer 186.

Figure 6E:
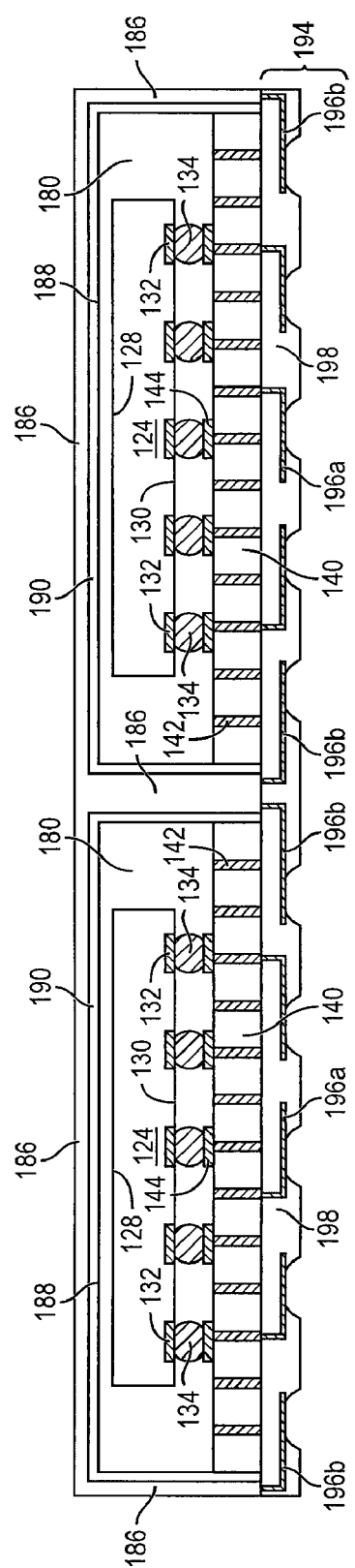

In FIG. 6e, a build-up interconnect structure 194 is formed over encapsulant 180 and semiconductor die 124. The build-up interconnect structure 194 includes an electrically conductive layer or RDL 196 formed using a patterning and metal deposition process such as sputtering, electrolytic plating, and electroless plating. Conductive layer 196 can be one or more layers of Al, Cu, Sn, Ni, Au, Ag, or other suitable electrically conductive material. Conductive layer 196a is electrically connected to contact pads 132 for routing signals. Conductive layer 196b is electrically connected to shielding layer 186 as a low impedance ground point. Other portions of conductive layer 196 can be electrically common or electrically isolated depending on the design and function of semiconductor die 124.

The build-up interconnect structure 194 further includes an insulating or passivation layer 198 formed between conductive layers 196 for electrical isolation using PVD, CVD, printing, spin coating, spray coating, sintering or thermal oxidation. The insulating layer 198 contains one or more layers of SiO2, Si3N4, SiON, Ta2O5, Al2O3, or other material having similar insulating and structural properties. A portion of insulating layer 198 is removed by an etching process to expose conductive layer 196 for bump formation or additional package interconnect.

Figure 6F:
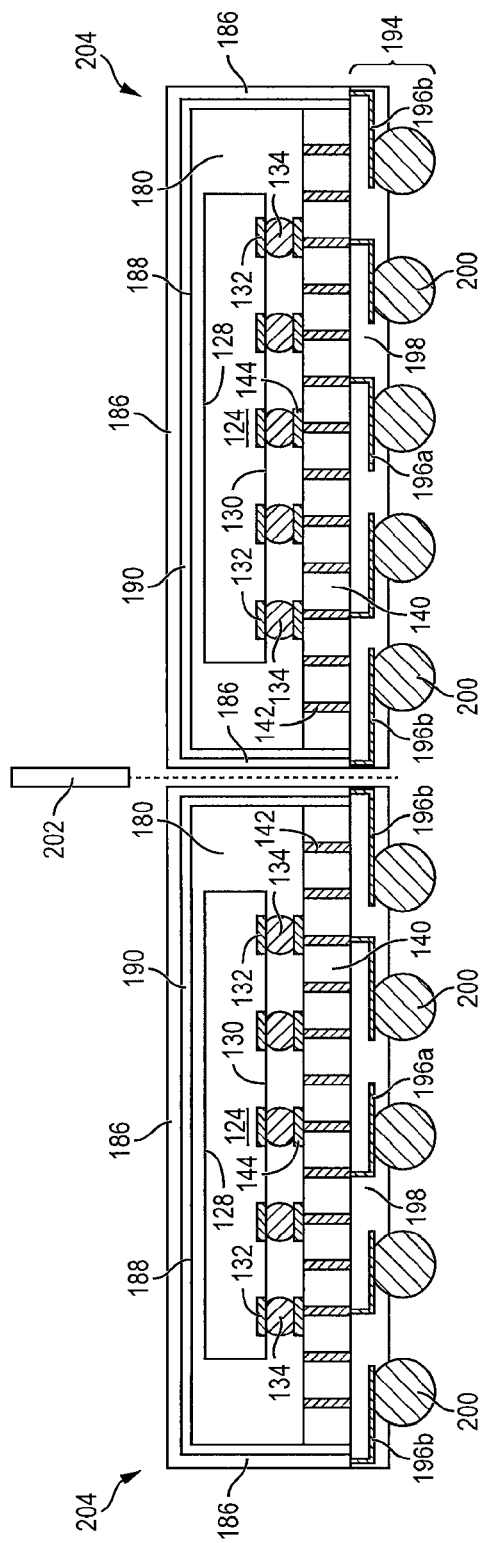

In FIG. 6f, an electrically conductive bump material is deposited over build-up interconnect structure 194 and electrically connected to conductive layer 196 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 196 using a suitable attachment or bonding process. In one embodiment, the bump material is reflowed by heating the material above its melting point to form spherical balls or bumps 200. In some applications, bumps 200 are reflowed a second time to improve electrical contact to conductive layer 196. An UBM layer can be formed under bumps 200. The bumps can also be compression bonded to conductive layer 196. Bumps 200 represent one type of interconnect structure that can be formed over conductive layer 196. The interconnect structure can also use bond wires, stud bump, micro bump, or other electrical interconnect.

The semiconductor device shown in FIG. 6f is singulated through shielding layer 186 and TSV interposer 140 using saw blade or laser cutting tool 202 to separate individual semiconductor die 124 into individual Fo-WLCSP 204. Shielding layer 186 is electrically connected to an external low impedance ground point through build-up interconnect structure 194.

Figure 7:
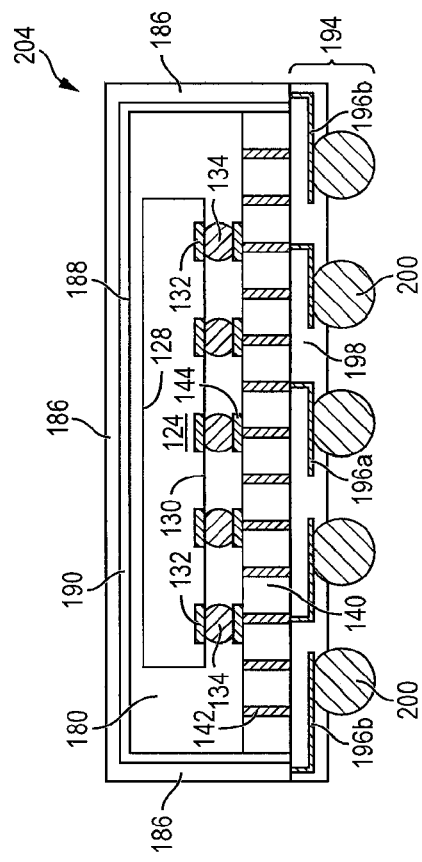
FIG. 7 illustrates the EMI and RFI shielding layer extending into the TSV interposer.

FIG. 7 shows Fo-WLCSP 204 after singulation. Semiconductor die 124 is electrically connected through TSV interposer 140 to conductive layer 196a of interconnect structure 194 and bumps 200. The wafer-level TSV interposer 140 with shielding layer 186 provides higher productivity in terms of manufacturing UPH at lower production cost for Fo-WLCSP 204. The flat shielding layer 186 is readily formed over encapsulant 180 to block or absorb EMI, RFI, and other interdevice interference. Shielding layer 186 provides EMI coverage over the top and around the sides of semiconductor die 124 and routes EMI, RFI, and other interfering signals through conductive layer 196b and bumps 200 to an external low-impedance ground point. Accordingly, the flat shielding layer 186 provides effective EMI and RFI shielding for the top and sides of semiconductor die 124.

Figure 8:
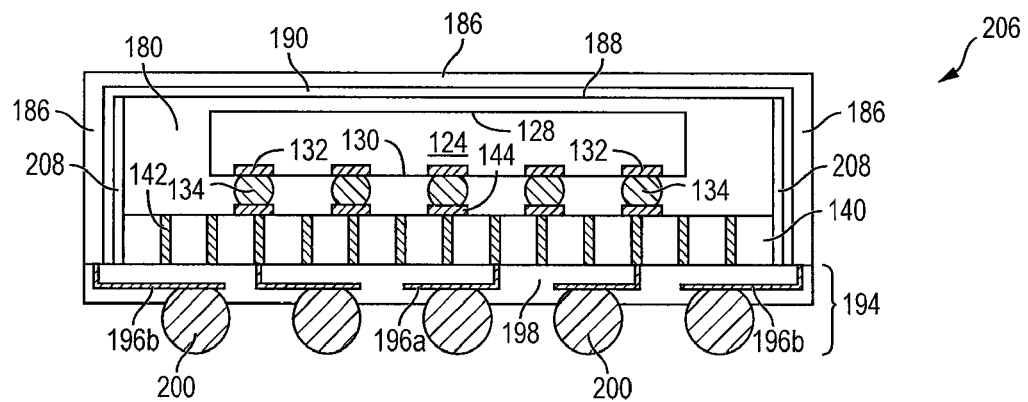
FIG. 8 illustrates an insulating layer between the EMI and RFI shielding layer and encapsulant and TSV interposer.

FIG. 8 shows an embodiment of Fo-WLCSP 206, similar to FIG. 7, with an insulating or dielectric material 208 formed in trench 182 over the side surfaces of encapsulant 180 and TSV interposer 140 prior to forming shielding layer 186, see FIG. 6b.

Figure 9:
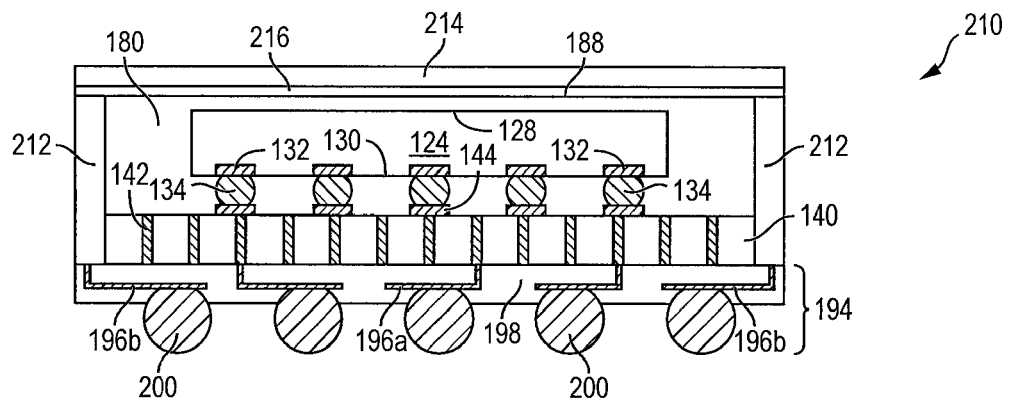
FIG. 9 illustrates the EMI and RFI shielding layer electrically connected to the TSV interposer with conductive paste.

FIG. 9 shows an embodiment of Fo-WLCSP 210, similar to FIG. 7, with a conductive paste 212 deposited in trench 182.

A shielding layer 214 and optional seed layer 216 are conformally deposited over top surface 188 of encapsulant 180. Shielding layer 214 is electrically connected through conductive paste 212 and build-up interconnect structure 194 to a low impedance external ground point.

Figure 10:
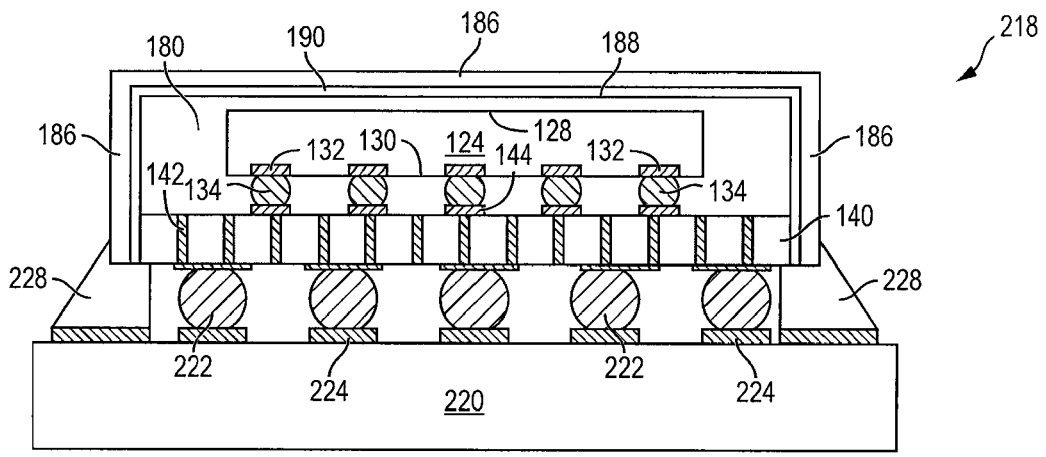
FIG. 10 illustrates the semiconductor die with EMI and RFI shielding layer and TSV interposer mounted to a PCB.

FIG. 10 shows another embodiment, similar to FIG. 7, with Fo-WLCSP 218 mounted to substrate or PCB 220. Bumps 222 are formed between TSVs 142 and bond pads or conductive traces 224 on substrate 220 for electrical interconnect. Shielding layer 186 is electrically connected to a low impedance external ground point on substrate 220 with conductive paste 228.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a plurality of conductive vias partially through the substrate;
   mounting a semiconductor die over the substrate;
   depositing an encapsulant over the semiconductor die and substrate;
   forming a trench through the encapsulant around the semiconductor die and aligned with one of the plurality of conductive vias;
   forming a shielding layer that conforms to the encapsulant and extends to the substrate;
   removing a portion of the substrate to expose the conductive vias; and
   forming an interconnect structure over the substrate opposite the semiconductor die, the interconnect structure being electrically connected to the conductive vias.

2. The method of claim 1, further including:
   forming the trench partially through the substrate; and
   forming the shielding layer in the trench partially through the substrate.

3. The method of claim 1, further including forming a conductive layer over the substrate, the conductive layer being electrically connected to the conductive vias.

4. The method of claim 1, further including forming an insulating layer in the trench prior to forming the shielding layer.

5. The method of claim 1, further including depositing conductive paste in the trench.

6. The method of claim 1, wherein the shielding layer is electrically connected to the interconnect structure.

7. The method of claim 1, further including removing a portion of the substrate to expose the shielding layer.

8. A method of making a semiconductor device, comprising:
   providing a substrate;
   forming a plurality of conductive vias in the substrate;
   mounting a semiconductor die over the substrate;
   depositing an encapsulant over the semiconductor die and substrate;
   forming a trench through the encapsulant proximate to the semiconductor die and aligned with one of the plurality of conductive vias;
   forming a shielding layer over the encapsulant; and
   forming an interconnect structure over the substrate opposite the semiconductor die, the interconnect structure being electrically connected to the conductive vias.

9. The method of claim 8, further including removing a portion of the substrate to expose the conductive vias.

10. The method of claim 8, further including:
forming the trench partially through the substrate; and
forming the shielding layer in the trench partially through the substrate.

11. The method of claim 8, further including forming a conductive layer over the substrate, the conductive layer being electrically connected to the conductive vias.

12. The method of claim 8, further including forming an insulating layer in the trench prior to forming the shielding layer.

13. The method of claim 8, further including depositing conductive paste in the trench.

14. The method of claim 8, wherein the shielding layer is electrically connected to the interconnect structure.

15. A method of making a semiconductor device, comprising:
providing a through silicon via (TSV) substrate;
mounting a semiconductor die over the TSV substrate;
depositing an encapsulant over the semiconductor die and TSV substrate;
forming a trench through the encapsulant proximate to the semiconductor die; and
forming a shielding layer that conforms to the encapsulant and extends into the trench and to the TSV substrate.

16. The method of claim 15, further including forming an interconnect structure over the TSV substrate opposite the semiconductor die.

17. The method of claim 15, further including removing a portion of the TSV substrate.

18. The method of claim 15, further including forming a conductive layer over the TSV substrate.

19. The method of claim 15, further including forming an insulating layer in the trench prior to forming the shielding layer.

20. The method of claim 15, further including depositing conductive paste in the trench.

21. A method of making a semiconductor device comprising:
providing a through silicon via (TSV) substrate;
mounting a semiconductor die over the TSV substrate;
depositing an encapsulant over the semiconductor die and TSV substrate;
forming a trench through the encapsulant proximate to the semiconductor die and partially through the TSV substrate; and
forming a shielding layer over the encapsulant and into the trench partially through the TSV substrate.

22. The method of claim 21, further including forming an interconnect structure over the TSV substrate opposite the semiconductor die.

23. The method of claim 21, further including removing a portion of the TSV substrate.

24. The method of claim 21, further including forming a conductive layer over the TSV substrate.

25. The method of claim 21, further including forming an insulating layer in the trench prior to forming the shielding layer.

26. A method of making a semiconductor device, comprising:
providing a substrate;
mounting a semiconductor die over the substrate;
depositing an encapsulant over the semiconductor die and substrate;
forming a trench through the encapsulant proximate to the semiconductor die; and
forming a shielding layer over the encapsulant that extends into the trench and to the substrate.

27. The method of claim 26, further including forming an interconnect structure over the substrate opposite the semiconductor die.

28. The method of claim 26, further including removing a portion of the substrate.

29. The method of claim 26, further including forming a conductive layer over the substrate.

30. The method of claim 26, further including forming an insulating layer in the trench prior to forming the shielding layer.

31. The method of claim 26, further including depositing conductive paste in the trench.

* * * * *